United States Patent

[11] 3,600,785

[72] Inventors Leslie J. Cook
2537 Regent St., Berkeley, Calif. 94704;
John E. Lindberg, 1211 Upper Happy Valley Road, Lafayette, Calif. 94549

[21] Appl. No. 866,855
[22] Filed Oct. 16, 1969
[45] Patented Aug. 24, 1971

[54] CIRCUIT BOARD ASSEMBLY LINE
4 Claims, 5 Drawing Figs.

[52] U.S. Cl. .......... 29/203 B, 29/407, 29/626
[51] Int. Cl. .......... H05k 13/04, B23q 17/00, H05k 3/30
[50] Field of Search .......... 29/203, 407, 626, 203 B

[56] References Cited
UNITED STATES PATENTS
3,216,101 11/1965 Miller .......... 29/626 X
3,372,455 3/1968 Howie .......... 29/203

*Primary Examiner*—Thomas H. Eager
*Attorney*—Owen, Wickersham & Erickson

ABSTRACT: An assembly line for placing a large number of circuit components at their proper locations on a series of identical printed circuit boards. A series of opaque support plates are supported above a light source, one plate for each station in the assembly line. Each plate has a series of windows or openings through which the light shines, and these correspond to the locations of the leads for the circuit components to be assembled to the circuit board at that station. In front of the support board is a series of bins, one for each component, and located generally beneath their respective openings. At each station, the components to be assembled are spaced rather widely apart across the board. Above the support board, one of each component to be assembled at that station is positioned generally vertically above the place where it is to be installed.

PATENTED AUG 24 1971 3,600,785

SHEET 1 OF 2

INVENTORS
LESLIE J. COOK
BY JOHN E. LINDBERG
Owen, Wickersham & Erickson
ATTORNEYS INVENTORS
LESLIE J. COOK
JOHN E. LINDBERG
BY
Owen, Wickersham & Erickson
ATTORNEYS

CIRCUIT BOARD ASSEMBLY LINE

This invention relates to an assembly line for placing a large number of circuit components at their proper locations on a series of identical printed circuit boards.

While printed circuit boards have saved a great deal of time and have eliminated many inaccuracies by virtue of their having done away with most writing, they have also made it even more important that each component be assembled at the right location, and they have pointed up the necessity for having an efficiently organized assembly line. Of course, some printed circuits can be fully assembled by automated machinery, but the invention here relates to situations where automation is not justified as a capital expenditure. This invention applies where the assembly is to be made by hand, and it is important that the operator get the right component and that he put it in the right place.

Such methods as that shown by the Miller U.S. Pat. No. 3,216,101 are satisfactory where small circuit boards are used, and only a small number of components are involved. The system shown in Howie U.S. Pat. No. 3,372,455 is also satisfactory for relatively small circuit boards, though confusion arises when a large number of components are to be located. It is too easy for the assembler to take the wrong component from stock and to put it in the wrong location because of inadequate distinction between the various installation points and the various components. They are located too close together, and it is difficult to do the work and remember which one is to go in which place. Thus, while these patents illustrate the advantage of having an opaque board with windows or openings through it, through which the light can shine to show the proper location on a circuit board, they still do not solve the problem to which this invention is addressed.

Circuit boards themselves may be translucent, and this is important in the invention. The main points of the invention are to prevent the confusion inherent when a large number of components have to be assembled and to enable achievement of greater accuracy. As compared with prior art systems, in which one person assembles all the components at a single station, the system eliminates a great deal of the inaccuracy and necessary checking and it certainly speeds up the operation so that it is many times as fast as it was heretofore. Even as compared with previous systems involving separate stations or at least separate keying boards or matrix boards, the system has great advantages in assuring simplicity and accuracy. This is done partly by having only a limited number of components assembled at each station, partly by having those components be ones which are widely spaced apart on the circuit board itself and therefore clearly distinguishable from each other, partly by having a series of bins located along the front where it will be readily accessible to the user and generally aligned vertically with where the components are supposed to go, and partly having those be just a few components, for usually about half a dozen at each station is plenty. Further, checking is provided by arranging along the top edge of the circuit board of each station a sample of each component in true vertical alignment with the position such a component is to take, so that the user can both check the color codes or other features of the unit which he is assembling and at the same time distinguish clearly between the components available.

Other objects and advantages of the invention will become apparent from the following description of a preferred embodiment.

Figures 1, 2:
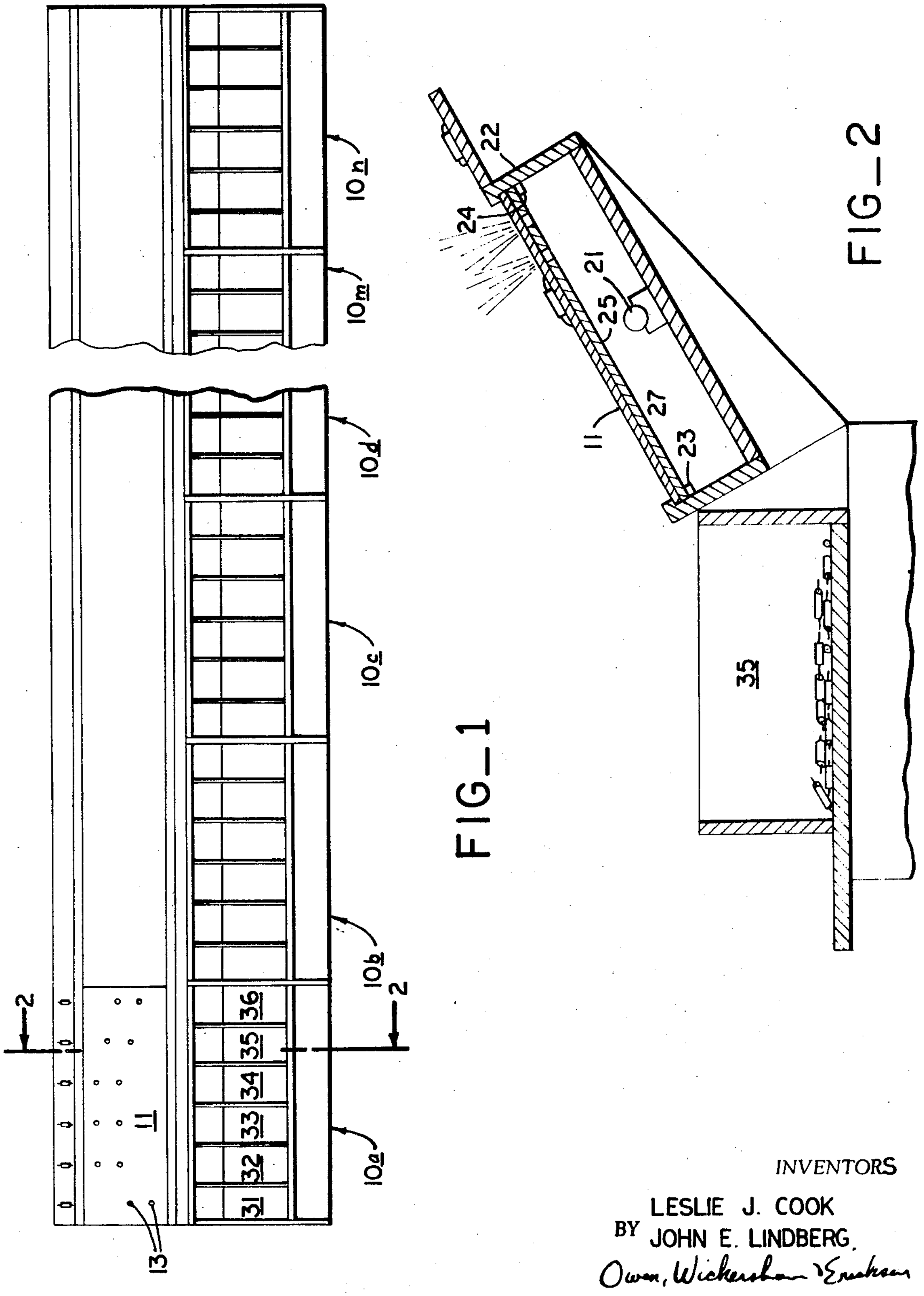
FIG. 1 is a top plan view of an assembly line, embodying the principles of the invention. Only a few of the stations are shown and the view is broken in the middle, in order to conserve space, many stations being omitted.
FIG. 2 is an enlarged view in side elevation and in section, taken through the line 2—2 in FIG. 1.

The assembly line of FIG. 1 has a plurality of stations, **10*a*, 10*b*, 10*c*, 10*d*,...10*m*, and 10 *n***. The total number of stations depends on how many components are to be assembled to the circuit board, for usually no more than about half a dozen components should be assembled at any one station. In some instances, possibly seven or eight can profitably be assembled at one station, but six is a preferable number, and in some instances there may be fewer. Thus, the number of stations is obtained by dividing the number of components to be assembled at each station into the total number of components to be assembled.

A printed circuit board 11 arrives at the first station **10*a* as a translucent plastic member, plated or otherwise provided with the printed circuit 12 and punched to provide a number of openings 13 through which leads of the various resistors, transformers, capacitors, coils, sockets, transistors, diodes, and so on, are to be inserted. After every component has had its leads properly placed in the board 11, and only then, the components may be secured to the board 11**, preferably by a single combined soldering operation, which is not shown in the drawings or described herein, since it is a standard operation.

At each station, **10*a*, 10*b*, 10*c*, 10*d*,...10*m*, and 10*n*, is provided a light well 20 in which a light source 21 which may be a series of fluorescent lamps or even a single continuous fluorescent lamp, or a series of other types of lamps, is housed. Above the light well 20 is a frame 22, best shown in FIG. 2, with cleats or recesses 23, 24 to hold at each station a single opaque indexing plate 25. This plate 25 may be made from Masonite or metal, and the important thing is that it is opaque and that it is provided at a plurality of key locations with windows 26**, which may simply be through openings.

Over this opaque plate 25 is set the printed circuit board. Usually the opaque plate 25 and the circuit board 11 are identical in size although the circuit board 11 may be somewhat smaller, so long as suitable keying means are provided for aligning it and making sure that the openings or windows 26 line up exactly with certain chosen openings 13 of the circuit board 11. When properly aligned, some of the holes through the circuit board 11 are directly in line with the little circles of light coming through the windows 26 through opaque plate 25. As shown in FIG. 2, preferably this assembly is set on an inclination to enable the working to be more simple that it would be where everything is flat or vertical.

At each station **10*a*, 10*b*, 10*c*, 10*d*,...10*m*, and 10*n*, are a plurality of bins 31, 32, 33, 34, 35, and 36, one for each of the circuit components 41, 42, 43, 44, 45, and 46** to be used at that station. If six components are to be added, then there are six bins. Of course, for any one installation, if it is desired to cut down the number of components, one or more of the bins may be left empty, or a new set with a different bins may be used. A feature of this invention is its versatility.

Each one of the bins 31, 32, 33, 34, 35, and 36 is stocked with a large number of components 41, 42, 43, 44, 45, or 46, which may be the actual number needed to complete the assembly of a known number of boards 11, or there may be a surplus of parts, or the bins may be restocked from time to time. A very important feature of this invention is that the opaque plate 25 itself is not only provided with sets of openings 26 to let the light through, to show where the different components are to be placed, but also that in this installation the locations for the components to be installed are spaced apart from each other. It may often even be desirable to have different types of components spread apart as much as possible. Thus, instead of having only resistors at some stations, it may be desirable to have a capacitor or two or a socket or something of that nature mixed in, so that the components are even more distinguishable from each other. If all the components at any one station are resistors, be resistor, it may be well to have all resistors of the same value put in at one station, so long as they are not otherwise easily confusable.

Thus, if all the resistors at one station are 100-ohm resistors, no mistake could be make at that station as to which component is going in. But otherwise, where different values of resistors are involved, it is wise to space apart the components from left to right so that each one is quite distinct from the other, and generally, they are aligned rather vertically above their respective bins, although this, of course, is not exactly possible, since the bins are spaced evenly apart and the components can rarely be.

Partly because of this difficulty, and partly also because of the need for providing a check at each station, above the opaque board, we prefer to mount a sample element, 41*a*, 42*a*, 43*a*, 44*a*, 45*a*, 46*a*, in direct vertical position above the opaque plate 25. Each element is thus perfectly aligned with respect to the element to be installed and is identified, so that if there is any need for checking the color code or nature of the element, this is provided automatically.

Thus, the opaque-keying plate 25, the printed circuit board 11, the bins 31, 32, 33, 34, 35 and 36, and the sample boards at each station, are all tied in with each other, and all cooperate with each other, to make proper identification of the circuit element easy and to make mistakes difficult to make, and to make it easy to check against errors.

A circuit board 11, once the operation at one station 10*a* is completed, goes to the next station 10*b*, next door, and so on step by step along the assembly line. Each circuit board 11 arrives at each station in substantially the same condition, and all boards 11 leave any one station in substantially the same condition. The operation is kept up for as many stations as necessary to install all the components, and then the board 11 is delivered to the soldering station.

It has been found by experience that relatively unskilled laborers with the normal intelligence and perceptiveness are easily able to perform these assembly operations without requiring high-cost labor and without great fatigue when doing it. It has also been found that checking after assembly becomes relatively simple, as compared with what had to be done in the prior art.

Figure 3:
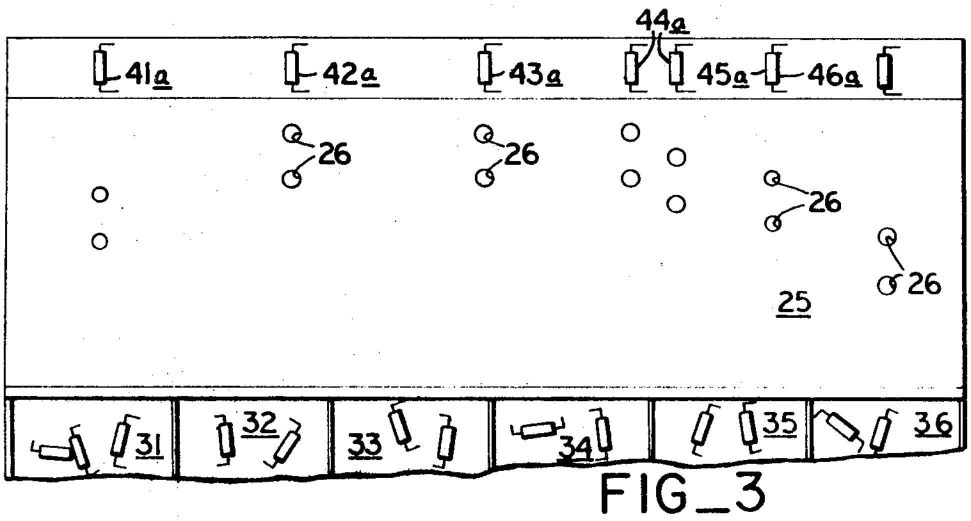
FIG. 3 is a plan view of one of the stations, showing the opaque support board in position.
Figure 4:
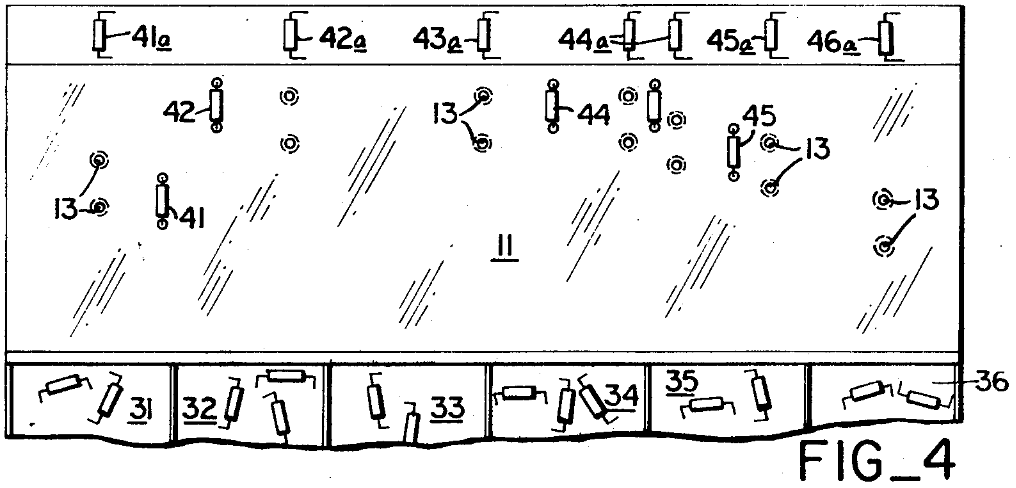
FIG. 4 is a similar view with a partially assembled printed circuit board in position over the support board prior to addition of the components at this station.
Figure 5:
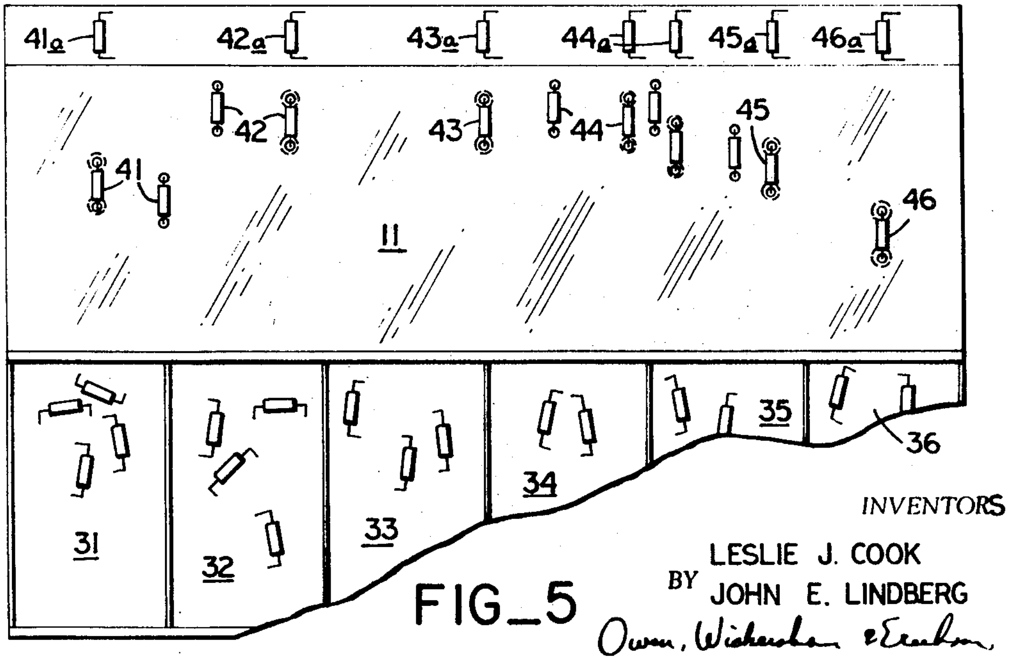
FIG. 5 is a similar view of the circuit board with assembly at that particular station completed and ready to go to an adjacent station.

FIG. 3 illustrates the placing of the proper keying board on the opaque plate, and FIG. 4, the location of the circuit board and the commencement of operations as it comes from the proceeding station, and FIG. 5, the completed board as it is ready to leave the station.

It should be understood from what has been said already that the assembly line is readily changed from one circuit board to another. The bins remain the same and are filled with the then-proper components, each bin again having its proper component. New sample boards and new keying boards are necessary but are readily put in place.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. An assembly line for placing a large number of circuit components at their proper locations on a series of identical printed circuit boards, including in combination a series of successive stations located side by side, an opaque support plate at each station on which a printed circuit board rests and with which it is registered during operations at that station, each said support plate being different from all the other support plates and having means for registering said printed circuit board therewith and having a plurality of pairs of transparent windows, corresponding to the proper locations of the leads, one pair of windows for each circuit component to be added at that station, each plate having only a small fraction of the total number of components to be assembled to said board, each station having only a few of said components to be assembled and those few being distributed widely across said board so that no two are very close to each other, a light source below said opaque support, a series of component-holding bins at each station, each for a different component to be assembled at that station, said bins being located side by side in front of said opaque support and each generally in line with the location of said windows that indicate where its said component is to go, whereby at each station, the assembler puts out the light through the windows by installing the component there.

2. The assembly line of claim 1, having just beyond an edge of said opaque plate that lies across the plate from the edge along which the bins are located, a sample board having one sample of each of said components for that station arranged directly in line with the windows corresponding to the proper location for installation of that component.

3. The assembly line of claim 2 wherein said opaque supports are inclined at a good viewing angle, said bins lying horizontally along their lower edge and said sample boards lying generally vertically adjacent the upper edge.

4. The assembly line of claim 1 wherein there are about six components at each station.